United States Patent
Dunn et al.

(10) Patent No.: US 10,052,789 B2
(45) Date of Patent: *Aug. 21, 2018

(54) METHODS OF PROCESSING CERAMIC FIBER

(71) Applicant: GENERAL ELECTRIC COMPANY, Schenectady, NY (US)

(72) Inventors: Daniel Gene Dunn, Guilderland, NY (US); James Anthony Ruud, Delmar, NY (US); Pierre-Andre Bui, Clifton Park, NY (US); Gregory Scot Corman, Ballston Lake, NY (US); James Scott Vartuli, Rexford, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 169 days.

This patent is subject to a terminal disclaimer.

(21) Appl. No.: 14/951,737

(22) Filed: Nov. 25, 2015

(65) Prior Publication Data
US 2017/0144329 A1 May 25, 2017

(51) Int. Cl.
*C04B 41/85* (2006.01)
*C23C 16/34* (2006.01)
(Continued)

(52) U.S. Cl.
CPC .............. *B28B 1/14* (2013.01); *C04B 35/80* (2013.01); *C04B 35/806* (2013.01); *C04B 41/85* (2013.01);
(Continued)

(58) Field of Classification Search
None
See application file for complete search history.

(56) References Cited

U.S. PATENT DOCUMENTS 2,267,597 A 12/1941 Neville et al.
2,628,173 A 2/1953 Fair, Jr.
(Continued)

FOREIGN PATENT DOCUMENTS

| JP | 5953640 S | 3/1984 |
|----|-----------|--------|
| WO | 9824737 A1 | 6/1998 |
| WO | 2014196574 A1 | 12/2014 |

OTHER PUBLICATIONS

U.S. Non-Final Office Action issued in connection with Related U.S. Appl. No. 14/951,650 dated Nov. 17, 2016.
(Continued)

*Primary Examiner* — Joseph A Miller, Jr.
(74) *Attorney, Agent, or Firm* — GE Global Patent Operation; John Darling (57) ABSTRACT

The present application provides methods and apparatus for processing ceramic fibers for the manufacture of ceramic matrix composites (CMCs). One method may include providing at least one frame including a planar array of unidirectional ceramic fibers extending across a void thereof. The method may further include at least one of depositing a coating on the ceramic fibers of the at least one frame via a chemical vapor deposition (CVD) process and impregnating the ceramic fibers with a slurry including a ceramic matrix precursor composition to form at least one CMC prepreg. In some embodiments, the ceramic fibers of the planar array may include a coating, and the method may include impregnating the coated ceramic fibers with a slurry including a ceramic matrix precursor composition to form at least one CMC prepreg.

12 Claims, 5 Drawing Sheets

(51) Int. Cl.
  *B28B 1/14* (2006.01)
  *C23C 16/26* (2006.01)
  *C04B 35/80* (2006.01)

(52) U.S. Cl.
  CPC .......... *C23C 16/26* (2013.01); *C23C 16/342* (2013.01); *C23C 16/345* (2013.01); *C04B 2235/3826* (2013.01); *C04B 2235/6028* (2013.01); *C04B 2235/614* (2013.01); *C04B 2235/616* (2013.01)

(56) References Cited

U.S. PATENT DOCUMENTS

| | | | |
|---|---|---|---|
| 5,015,540 | A | 5/1991 | Borom et al. |
| 5,196,235 | A | 3/1993 | Parlier et al. |
| 5,330,854 | A | 7/1994 | Singh et al. |
| 5,336,350 | A | 8/1994 | Singh |
| 5,569,343 | A * | 10/1996 | Garrigus ............. B32B 5/26 156/171 |
| 5,628,938 | A | 5/1997 | Sangeeta et al. |
| 5,681,617 | A | 10/1997 | Lin et al. |
| 6,000,442 | A | 12/1999 | Busgen |
| 6,024,898 | A | 2/2000 | Steibel et al. |
| 6,403,158 | B1 | 6/2002 | Corman |
| 6,432,537 | B1 | 8/2002 | Devlin et al. |
| 6,503,441 | B2 | 1/2003 | Corman et al. |
| 7,318,906 | B2 | 1/2008 | Kohyama et al. |
| 2004/0067316 | A1 | 4/2004 | Gray et al. |
| 2006/0043628 | A1 | 3/2006 | Matsumoto |
| 2007/0096371 | A1 | 5/2007 | McGuigan et al. |
| 2016/0123670 | A1 | 5/2016 | Tomita et al. |

OTHER PUBLICATIONS

European Search Report and Opinion issued in connection with corresponding EP Application No. 16200454.3 dated Apr. 19, 2017.
European Search Report and Opinion issued in connection with Related EP Application No. 16200457.6 dated Apr. 19, 2017.

* cited by examiner

METHODS OF PROCESSING CERAMIC FIBER

BACKGROUND OF THE INVENTION

The present disclosure is generally directed to methods and apparatus for processing ceramic fiber. More particularly, the present disclosure is directed to methods and apparatus for processing ceramic fiber for the manufacture of ceramic matrix composite (CMC) articles.

Ceramic matrix composites (CMCs) generally comprise a ceramic fiber reinforcement material embedded in a ceramic matrix material. The reinforcement material may be discontinuous short fibers that are randomly dispersed in the matrix material or continuous fibers or fiber bundles oriented within the matrix material. The reinforcement material serves as the load-bearing constituent of the CMC in the event of a matrix crack. In turn, the ceramic matrix protects the reinforcement material, maintains the orientation of its fibers, and serves to dissipate loads to the reinforcement material. Silicon-based CMCs, such as silicon carbide (SiC) as the matrix and/or reinforcement material, have become of particular interest in high-temperature applications due to their high temperature capabilities, such as for use in components of gas turbines, including aircraft gas turbine engines and land-based gas turbine engines. SiC fibers have also been used as a reinforcement material for a variety of other ceramic matrix materials, including TiC, Si3N4, and Al2O3.

Continuous fiber reinforced ceramic composites (CFCC) are a particular type of CMC that offers light weight, high strength, and high stiffness for a variety of high temperature load-bearing applications, such as in shrouds, combustor liners, vanes (nozzles), blades (buckets), and other high-temperature components of gas turbines. A notable example of a CFCC material developed by the General Electric Company under the name HiPerComp® contains continuous SiC fibers in a matrix of SiC and elemental silicon or a silicon alloy.

Various techniques may be employed in the fabrication of CMCs, including chemical vapor infiltration (CVI), wet drum winding, lay-up, lamination, pyrolysis, and melt infiltration (MI). These fabrication techniques have been used in combination with tooling or dies to produce near-net-shape articles through processes that include the application of heat and chemical processes at various processing stages. Examples of such processes, particularly for SiC/Si—SiC (fiber/matrix) CFCC materials, are disclosed in U.S. Pat. Nos. 5,015,540, 5,330,854, 5,336,350, 5,628,938, 6,024,898, 6,258,737, 6,403,158, and 6,503,441, and U.S. Patent Application Publication No. 2004/0067316.

Figure 1:
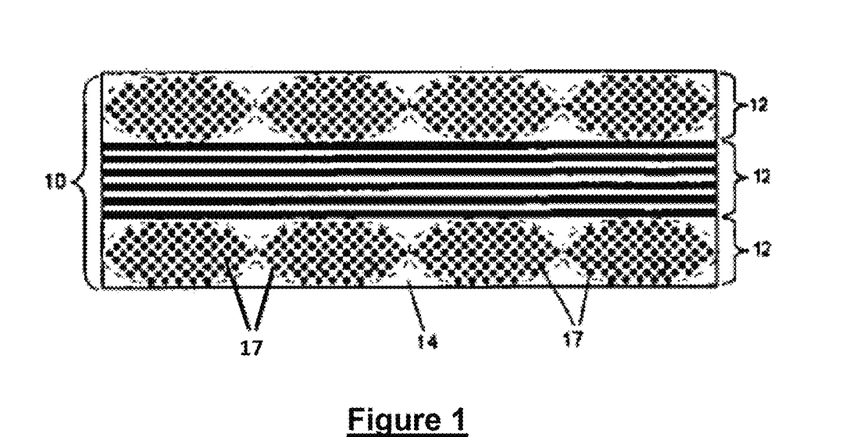
FIG. 1 is a cross-sectional view of a portion of a ceramic matrix composite (CMC) article.

One process of manufacturing CMCs entails the use of CMC prepregs, which are typically sheet-like structures comprising the reinforcement fibers impregnated with a slurry that contains a precursor of the matrix material and one or more organic binders. The prepreg must undergo processing (e.g., firing) to convert the precursor to the desired ceramic matrix material. Prepregs for CFCC materials frequently comprise a two-dimensional fiber array comprising a single layer of aligned tows (bundles of individual filaments) impregnated with a matrix precursor to create a generally two-dimensional lamina. Multiple plies of the resulting prepregs are then stacked and debulked to form a laminate preform, a process referred to as "lay-up." The prepregs are typically, but not necessarily, arranged so that tows of adjacent prepregs are oriented transverse (e.g., perpendicular) to each other, providing greater strength in the laminar plane of the preform (corresponding to the principal (load-bearing) directions of the final CMC article). As an example, FIG. 1 represents a surface region of a CMC article 10 including multiple laminae 12, each the result of individual prepreg tapes or sheets. As also shown in FIG. 1, each lamina 12 contains a ceramic reinforcement made up of unidirectionally-aligned fibers 17 encased in a ceramic matrix 14 formed by conversion of the ceramic matrix precursor (e.g., after firing).

Figure 2:
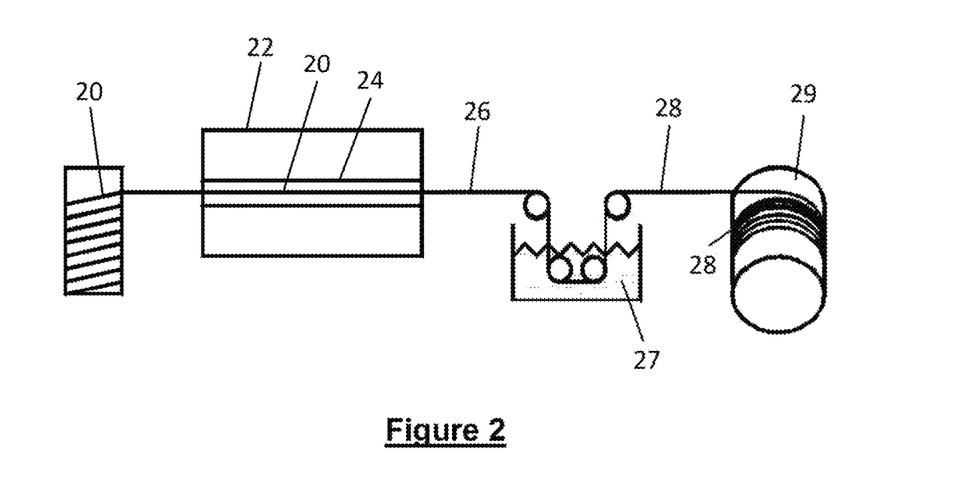
FIG. 2 illustrates ceramic fiber coating and ceramic fiber impregnating processes.

As illustrated in FIG. 2, one process utilized in making prepreg CMC preforms includes a winding technique to form the fibers 20 (individual filaments or tows) into a unidirectional prepreg tape, which is then used for the lay-up of the composite preform. As represented in FIG. 2, some winding techniques involve coating the fibers 20. The fibers 20 are coated for several purposes, such as to protect them during composite processing, to modify fiber-matrix interface strength and to promote or prevent mechanical and/or chemical bonding of the fiber and matrix. A number of different techniques have been developed for applying coatings to ceramic fiber, such as slurry-dipping, sol-gel, sputtering and chemical vapor deposition (CVD). Of these techniques, CVD may be considered as being most successful in producing impervious coatings of uniform thickness and controlled composition. In a typical CVD process, the fibers and reactants are heated to an elevated temperature where coating precursors decompose and deposit as the coating.

Continuous fiber coating processes have been preferred for composites processed by the winding technique. In a continuous coating process, as shown in FIG. 2, fiber 20 is continuously passed through a CVD reactor 22 containing coating precursors 24 to form the coated fiber 26. As also shown in FIG. 2, a continuous fiber coating process may involve running a single fiber tow or filament 20 through the CVD reactor 22 at a time. The coating may be conducted at low pressure, and the fiber 20 may be transported through the reactor 22 at a slow speed, to insure uniform coating on the coated fiber 26. Such a CVD coating process suffers from a significant amount of broken fibers, and "loose" fibers when a fiber tow is coated (i.e., "fuzz"), which degrades throughput or yield of the process. Although such a fiber coating process may provide an effective coated fiber 26, there remains a need for further improvements to CVD coat fibers 20 with higher productivity.

As illustrated in FIG. 2, a winding technique may also form the coated fiber 26 (a filament or tow) into a unidirectional prepreg tape by impregnating the coated fiber 26 with a matrix precursor 27. For example, a wet drum winding processes for impregnating the coated ceramic fiber 26 may entail pulling the ceramic fiber 26 through a bath 27 of a matrix precursor slurry mixture that includes suitable matrix precursor materials, organic binders, and solvents, as shown in FIG. 2. The resulting precursor-impregnated fiber 28 is then wound around a drum 29 to form a planar unidirectional prepreg tape. Before contacting the drum 29, the precursor-impregnated fiber 28 is typically pulled through an orifice to control the amount of slurry picked up. By indexing the drum 29 (and/or the bath 27 and orifice), the precursor-impregnated fiber 28 is laid down at a constant pitch to yield a continuous, planar unidirectional prepreg tape. Prior to being wound with the precursor-impregnated fiber 28, the drum 29 may be wrapped with a release sheet so that the resulting prepreg tape can be more easily removed from the drum 29. While on the drum 29, the prepreg tape may be allowed to air dry by allowing the solvents to evaporate. Alternatively, the tape may be cut from the drum 29, laid flat, and allowed to air dry.

Prepreg tapes produced by such a wet drum winding processes may have a surface roughness, or waviness, corresponding to the pitch of the fiber 28 on the drum 29. There may also be variability in the distribution of fiber and matrix across the tape because of the pitch. Furthermore, because the fiber is under tension during the winding process, the impregnated fiber 28 may tend to be pulled down onto the drum surface, yielding a prepreg tape that has proportionally more fiber at the surface of the tape contacting the drum 29 and proportionally more matrix precursor at the surface of the tape facing away from the drum 29.

Such a wet drum winding process can also suffer from a significant amount of broken fibers, and loosely adhering fibers 20 (i.e., "fuzz") when a tow is utilized, that can break off and cause blockage of the orifice. Consequently, drum winding operations may require constant operator supervision so that such blockages can be removed as they occur.

Another complication of a drum winding processes may revolve around necessity to completely impregnate (i.e., wet out) the fiber 20 with the slurry 27 during the winding process, which requires that the fiber 16 spend a sufficient amount of time submersed in the slurry 27. This submersion time, which can be about five seconds for certain processes, may place a limit on the speed with which the fiber 16 can be drawn through the slurry 27 bath. Consequently the time necessary to drum wind a 100 meter fiber 20 tow can be relatively lengthy.

Accordingly, alternative methods and apparatus for coating and/or impregnating ceramic fiber (to form prepregs) for producing CMCs with improved yield or throughput are desirable.

SUMMARY OF THE INVENTION

In one aspect, the application provides for a method of processing ceramic fiber for the manufacture of a ceramic matrix composite (CMC) article. The method includes providing at least one frame including a planar array of unidirectional ceramic fibers extending across a void thereof. The method further include at least one of: depositing a coating on the ceramic fibers of the least one frame via a chemical vapor deposition (CVD) process; and impregnating the ceramic fibers of the at least one frame with a slurry including a ceramic matrix precursor composition to form at least one CMC prepreg.

In some embodiments, the method may include depositing a coating on the ceramic fibers of the least one frame via a chemical vapor deposition (CVD) process. In some such embodiments, the CVD process may include positioning the at least one frame within a CVD reactor, and the CVD process may be a batch CVD process. In some other such embodiments, the coating may include at least one layer including boron nitride, silicon-doped boron nitride, carbon, silicon carbide or silicon nitride.

In some embodiments, the method may include impregnating the ceramic fibers of the at least one frame with a slurry including a ceramic matrix precursor composition to form at least one CMC prepreg. In some such embodiments, impregnating the ceramic fibers of the at least one frame may include coupling a base plate to the at least one frame extending at least partially within the void thereof such that the ceramic fibers and the ceramic matrix precursor composition form at least one CMC prepreg tape. In some other such embodiments, impregnating the ceramic fibers may include removing the ceramic fibers from at least a portion of the at least one frame and impregnating the removed ceramic fibers with the slurry. In some other such embodiments, the ceramic fibers may include a coating with at least one layer including boron nitride, silicon-doped boron nitride, carbon, silicon carbide or silicon nitride.

In some embodiments, the method may include impregnating the coated ceramic fibers of the at least one frame with a slurry including a ceramic matrix precursor composition to form CMC prepregs. In some embodiments, providing the at least one frame may include coupling the ceramic fibers to at least one frame. In some embodiments, at least one of the ceramic fibers may include a ceramic fiber tow. In some embodiments, at least one of the ceramic fibers may include a non-bundled ceramic filament. In some embodiments, a plurality of the ceramic fibers may include portions of at least one continuous ceramic fiber that extends through the void a plurality of times. In some embodiments, at least one of the ceramic fibers may include a portion of at least one discrete ceramic fiber that extends once through the void. In some embodiments, the ceramic fibers may be substantially SiC.

In another aspect, the present disclosure provides for a method of processing ceramic fiber for the manufacture of a ceramic matrix composite (CMC) article. The method includes providing at least one frame including a planar array of unidirectional ceramic fibers extending across a void thereof. The method further includes impregnating the ceramic fibers of the at least one frame with a slurry including a ceramic matrix precursor composition to form at least one CMC prepreg.

In some embodiments, impregnating the ceramic fibers of the at least one frame may include coupling a base plate to the at least one frame extending at least partially within the void thereof such that the ceramic fibers and the ceramic matrix precursor composition form at least one CMC prepreg tape. In some embodiments, impregnating the ceramic fibers may include removing the ceramic fibers from at least a portion of the at least one frame and impregnating the removed ceramic fibers with the slurry. In some embodiments, the ceramic fibers may include a coating with at least one layer including boron nitride, silicon-doped boron nitride, carbon, silicon carbide or silicon nitride. In some such embodiments, the method may further include depositing the coating on the ceramic fibers of the least one frame via a chemical vapor deposition (CVD) process.

These and other objects, features and advantages of this disclosure will become apparent from the following detailed description of the various aspects of the disclosure taken in conjunction with the accompanying drawings.

DETAILED DESCRIPTION

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements. Any examples of parameters are not exclusive of other parameters of the disclosed embodiments. Components, aspects, features, configurations, arrangements, uses and the like described, illustrated or otherwise disclosed herein with respect to any particular embodiment may similarly be applied to any other embodiment disclosed herein.

FIGS. 3-8 illustrate an exemplary ceramic fiber processing apparatus 32 according to the present disclosure. The apparatus 32 may facilitate or provide for the processing of ceramic fiber for the manufacture of a ceramic matrix composite (CMC) article. For example, the apparatus 32 may facilitate the coating of ceramic fiber via a batch process and/or the formation of a prepreg tape (e.g., infiltration) from coated ceramic fiber via a batch process. Alternatively, a plurality of the apparatuses 32 may be coupled together, or each apparatus 32 may form a portion or a segment of larger structure, that facilitates the coating of ceramic fiber via a continuous process and/or the formation of a prepreg tape including coated ceramic fiber via a continuous process.

Figure 3:
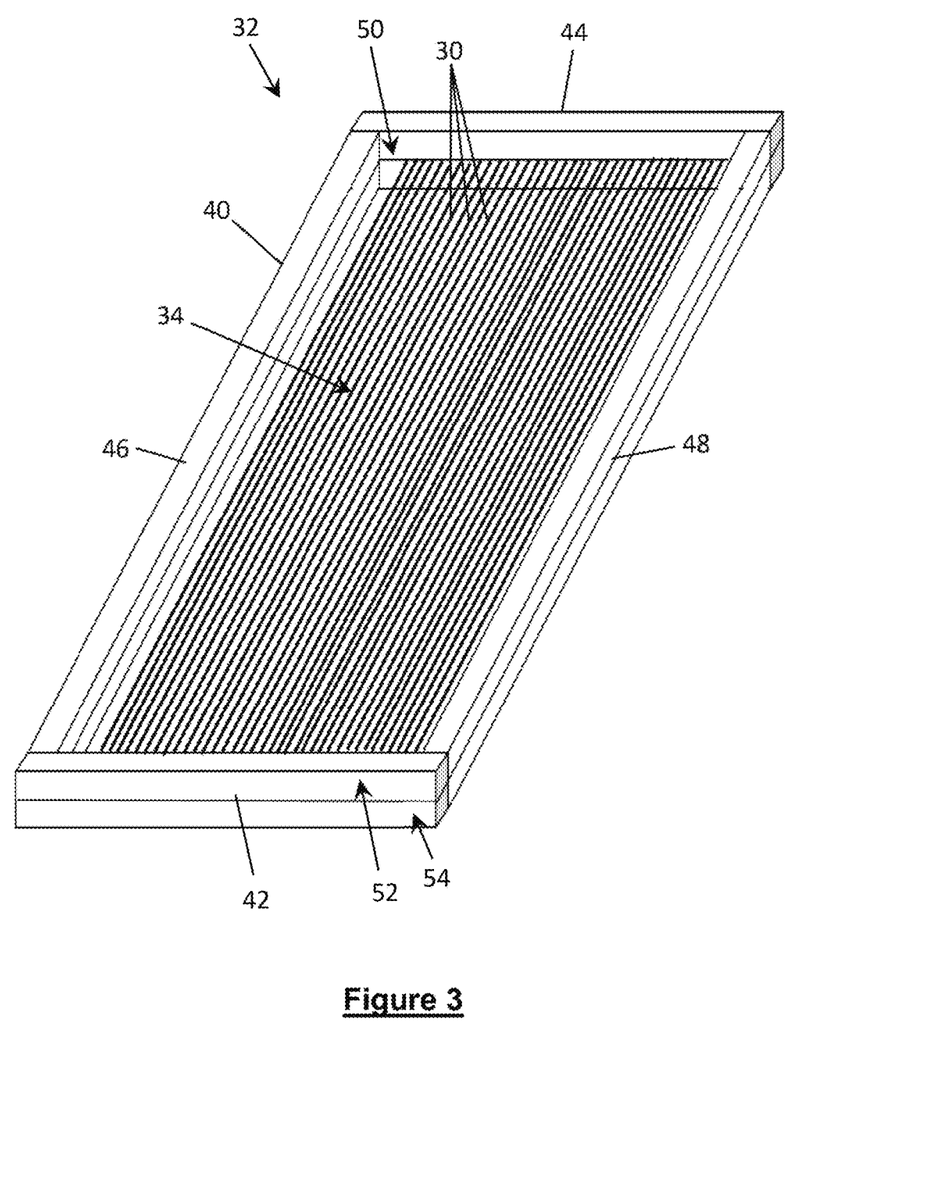
FIG. 3 is a perspective view of an apparatus for processing ceramic fiber according to the present disclosure.
Figure 4:
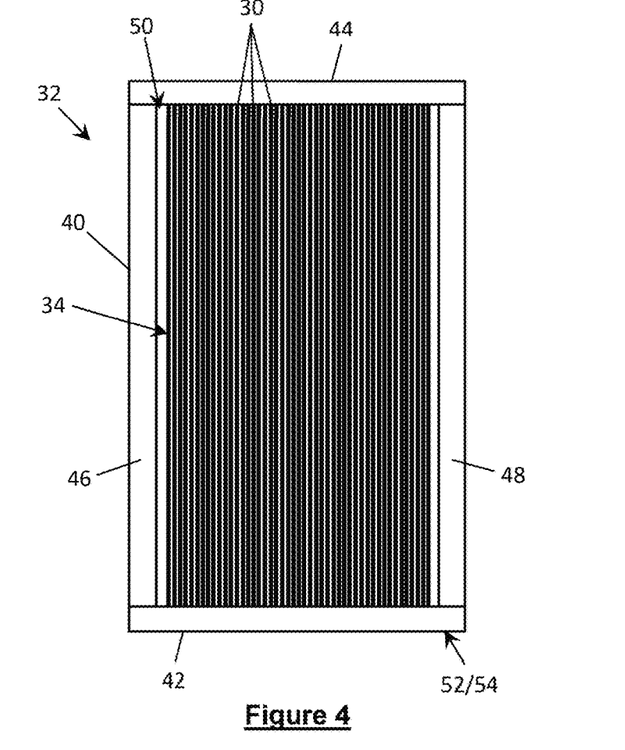
FIG. 4 is a top view of the apparatus of FIG. 3.
Figure 5:
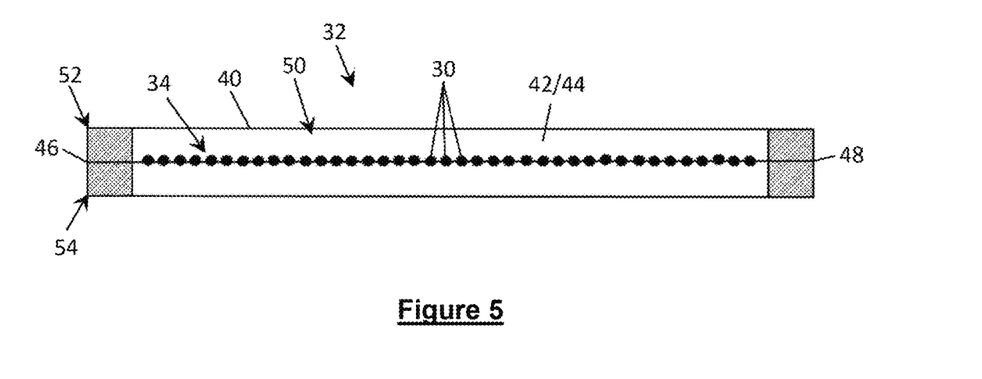
FIG. 5 is a cross-sectional view of the apparatus of FIG. 3.

As shown in FIGS. 3-5, the processing apparatus 32 may include a frame 40 that forms a void 50, and a plurality of ceramic fibers 30 extending across the void 50. Each of the plurality of ceramic fibers 30 may extend across the void 50 and be positioned within the void 50 (entirely or partially) or adjacent to the void 50. In this way, the void 50 may expose the ceramic fibers 30. The ceramic fibers 30 may be at least portions of individual ceramic filaments or strands, ceramic fiber tows, or a combination of individual filaments and tows. It will be appreciated that a "ceramic fiber tow" or simply a "tow," as used herein, refers to a bundle of a plurality of individual ceramic filaments or loose strands. The filaments of a tow may be randomly intermingled or arranged in a pattern, and/or may be continuous or non-continuous. For example, a tow may include broken filaments or filament segments. As another example, the filaments of a tow may be substantially parallel, twisted or otherwise arranged. A tow may act substantially in the same manner as a single or individual filament. It will also be appreciated that an "individual ceramic filament," or simply an "individual filament," as used herein, refers to a singular or non-bundled elongate ceramic member.

The ceramic fibers 30 may each extend substantially in a first direction across the void 50, such as from a first portion 42 to a second portion 44 of the frame. In this way, the ceramic fibers 30 may be unidirectional (e.g., for the formation of a unidirectional CMC prepreg tape and/or a unidirectional CMC article, as is known in the art). The ceramic fibers 30 may include relatively minor directional variations as they extend across the void 50, but the ceramic fibers 30 may be unidirectional such that they extend substantially in the first direction and do not cross-over each other. Similarly, the ceramic fibers 30 may include minor directional variations, but the ceramic fibers 30 may be unidirectional such that they extend substantially along the first direction and/or substantially parallel to one another, as a whole. If the ceramic fibers 30 include at least one tow, the at least one tow, as a whole, may be unidirectional (extend along the first direction) and/or the ceramic filaments making up the tow may be unidirectional. In some other embodiments, the ceramic filaments of a tow of the ceramic fibers 30 may extend in differing directions than the first direction (i.e., are non-unidirectional, such as twisted or woven filaments), but tow, as a whole, may extend substantially in the first direction such that the ceramic fibers 30 across the void 50 are unidirectional.

As shown in FIGS. 3-5, the unidirectional ceramic fibers 30 extending across the void 50 of the frame 40 may form a planar array. For example, the unidirectional ceramic fibers 30 may be substantially arranged or positioned along a plane across the void 50. In this way, the processing apparatus 32 may include a substantially planar array of substantially unidirectional ceramic fibers 30 extending across the void 50 of the frame 40. The planar arrangement of the ceramic fibers 30 may include relatively minor variations or outliers, but the ceramic fibers 30 may, as a whole, be arranged along a plane. For example, as explained further below at least one of the ceramic fibers 30 may include a plurality of individual ceramic filaments, such as a tow (as shown in FIG. 1). In some such embodiments, while the individual ceramic filaments may be off-plane (at least with respect to each other), the ceramic fibers 30, as a whole, may be substantially arranged on a plane such that the ceramic fibers 30 across the void 50 form, as a whole, a substantially planar array (and the ceramic fibers 30 may be unidirectional).

The unidirectional ceramic fibers 30 forming the planar array may be spaced from each other, as a whole, as shown in FIGS. 3-5. The spacing of the ceramic fibers 30 may be particularly configured to expose a maximum amount of the exterior surface of the fibers 30 (e.g., the filaments making a tow) to ensure formation of a coating thereon, as explained further below. As another example, the spacing of the ceramic fibers 30 may be particularly configured in consideration of the material of the ceramic fibers 30 for the formation of a prepreg therefrom (as explained further below) and/or a desired performance or application of a CMC ultimately formed from the ceramic fibers 30, as explained further below. The frames 40 disclosed herein may provide for effective and consistent ceramic fiber 30 arrangement at relatively low tensions thereof, which facilitates maximum coating coverage and/or fiber arrangement during impregnation. It is noted, however, that the ceramic fibers 30 may include some minor variations in arrangement (e.g., filament breakage) that results in uneven spacing and/or abutting or intersecting of some of the fibers 30. As a whole, however, the ceramic fibers 30 may be spaced from one another. In some embodiments, the unidirectional ceramic fibers 30 (whether tows or single filaments), as a whole, may be substantially evenly spaced throughout the planar array, or the spacing may vary. If the ceramic fiber portions 30 are tows, the frame 30 may be configured such that the ceramic filaments making up each tow are spaced from each other. In such embodiments, the spacing of adjacent tows (i.e., the spacing between adjacent ceramic filaments of adjacent tows) may be spaced about the same distance as the spacing of the individual filaments of the tows. In some embodiments, the ceramic fibers 30 may be positioned and spaced from each other such that the density and arrangement of filaments thereof is substantially uniform throughout the width and/or length and/or thickness of the planar array.

At least one of the unidirectional ceramic fibers 30 extending across the void 50 of the frame 40 may be a portion of a ceramic fiber that also includes one or more portion positioned exterior to the void 50. Alternatively, at least one of the ceramic fibers 30 may not be a portion of a longer ceramic fiber, and such a ceramic fiber 30 may, potentially, be contained entirely across the void 50. The unidirectional ceramic fibers 30 extending across the void 50 may be formed of separate and distinct ceramic fibers (tow or filament), portions of one or more continuous ceramic fiber (tow or filament), or a combination of separate and distinct ceramic fibers and portions of one or more continuous ceramic fiber. For example, at least some of the ceramic fibers 30 passing across or through the void 50 may be portions of a continuous ceramic fiber. In this way, the ceramic fibers 30 extending across the void 50 may be portions of at least one continuous ceramic fiber that extends across the void 50 a plurality of times. Each pass or portion of such a continuous ceramic fiber extending across the void 50 may be one of the unidirectional ceramic fibers 30 of the planar array 34. In some such embodiments, two or more of the passes or portions of the continuous ceramic fiber extending across the void 50 (and forming unidirectional ceramic fibers 30 of the planar array 34) may be contiguous portions thereof. As another example, at least one of the ceramic fibers 30 across the void 50 and forming the planar array 34 may be at least a portion of a unique or distinct ceramic fiber. The unidirectional ceramic fibers 30 extending across the void 50 and forming the planar array 34 may thereby include at least one discrete ceramic fiber that extends or passes once across the void 50. In this way, two of the ceramic fibers 30 extending or passing across the void 50 and forming the planar array 34 may be at least portions of two separate and distinct ceramic fibers.

The unidirectional ceramic fibers 30 of the planar array 34 across the void 50 of the frame 40 may be any ceramic material suitable for the manufacture of CMC prepregs and, ultimately, CMC articles. For example, the ceramic fibers 30 may be primarily carbon (C), silicon carbide (SiC), alumina (Al2O3) and/or mullite (Al2O3-SiO2) based fibers. The ceramic fibers 30 may contain other elements and/or impurities in addition to the base or primary material, such as C, O, N, Ti, Zr, B, for example. In some embodiments, the apparatus 32 may be particularly advantageous for coating silicon carbide fibers (i.e., pure SiC fibers or primarily SiC based fibers) and/or forming a prepreg with such coated silicon carbide fibers. In such embodiments, the apparatus 32 may include a planar array 34 of unidirectional silicon carbide ceramic fibers 30 extending across the void 50 of the frame 40.

The frame 40 may be of any design, configuration or mechanism that forms a space or void 50 and supports the planar array 34 of unidirectional ceramic fibers 30 across the void 50. The void 50 may be of any size or shape for any corresponding size or shape planar array 34. The void 50 may be an unobstructed area in which the planar array 34 is provided. In some embodiments, the frame 40 may be configured such that the area about the void (and thereby also about the planar array 34 of unidirectional ceramic fibers 30 positioned therein) is open or unobstructed. For example, the frame 40 may be configured such that the area above and/or below the planar array 34 of unidirectional ceramic fibers 30 is unobstructed to allow for unhindered coating of the ceramic fibers 30. As shown in the cross-sectional view in FIG. 5, the planar array 34 of unidirectional fibers 30 may be positioned in a medial portion of the thickness of the void 50 and/or frame 40. When a plurality of frames 40 are stacked on each other in the thickness direction, the planar arrays 34 are there spaced from each other and the void 50 remains substantially unobstructed.

The frame 40 may support or couple to the planar array 34 of unidirectional ceramic fibers 30 across the void 50 via any mechanism. In some embodiments, the frame 40 may be configured to couple to ends or end portions of the ceramic fibers 30 and provide a tensile force sufficient to maintain the planar array 34 and unidirectional direction of the ceramic fibers 30. In some embodiments, the frame 40 may include a tensioning mechanism that is configured to adjust the tension of the ceramic fibers 30. In this way, the tensioning mechanism may be effective to apply a tension to the ceramic fibers 30 after the ceramic fibers 30 are coupled to the frame 40 to form (and maintain) the unidirectional, planar array 34 configuration of the ceramic fibers 30. The tension needed to form and/or maintain the planar array 34 and unidirectional direction of the ceramic fibers 30 may vary depending upon the particular fiber composition, for example.

As noted above, the frame 40 may be of any configuration to form the void 50 and may couple with the ceramic fibers 30 in any manner to form the unidirectional, planar array 34 in the void 50. One example of a configuration of the frame 40 is shown in FIGS. 3-5. As shown in FIGS. 3 and 5, the frame 30 may include an upper frame portion 52 and a lower frame portion 54. Each of the upper frame 52 and the lower frame portion 54 may include a first fiber support member 42 and a second fiber support member 44. The void 50 of the frame 40 may extend between the first fiber support member 42 and a second fiber support member 44, as shown in FIGS. 3-5. As also shown in FIGS. 3-5, the frame 40 may include a first spacing member 46 and/or a second spacing member 48 that extend between the first and second fiber support members 42, 44. The void 50 of the frame 40 may also extend between the first and second spacing members 46, 48. The first and second fiber support members 42, 44 and the first and second spacing members 46, 48 may be orientated at right angles with respect to each other such that the frame 40 (and, potentially, the void 50) is a rectangular or square shape. The first and second fiber support members 42, 44 may act to rigidly affix and space the second fiber support members 42, 44.

End portions of the ceramic fibers 30 may be coupled to the first and second fiber support members 42, 44 such that the unidirectional, planar array 34 extends there between across and/or through the void 50. For example, as shown in FIGS. 3 and 5 the end portions of the ceramic fibers 30 may be clamped or otherwise secured between the first and second fiber support members 42, 44 of the upper portion 52 and the first and second fiber support members 42, 44 of the lower portion 54 of the frame 50, respectively. In this way, the end portions of the ceramic fibers 30 may be positioned between the first and second fiber support members 42, 44 of the upper portion 52 and the first and second fiber support members 42, 44 of the lower portion 54, respectively, and the upper 52 and lower 54 portions may be affixed to each other to secure the ceramic fibers 30 to the frame 40. The upper 52 and lower 54 portions of the frame 40 may be selectively coupled or affixed to each other such that after the planar array 34 of unidirectional fibers 30 is processed (as explained further below), the upper 52 and lower 54 portions can be selectively separated to release the end portions of the ceramic fibers 30 from between the first and second fiber support members 42, 44.

In some embodiments, the frame 40 example shown in FIGS. 3-5 may be formed by a wrapping or winding technique. For example, one or more ceramic fibers may be wrapped or wound a plurality of times over the first and second fiber support members 42, 44 of a pair of overlapping or stacked lower portions 54, (or upper portions 52) to form two planar arrays 34 of unidirectional fibers 30. In this way, one planar array 34 may be formed proximate to a top surface of the "top" lower portion 54 of the pair of stacked lower portions 54 and another array 34 may be formed proximate to a bottom surface of the "bottom" lower portion 54 of the pair of stacked lower portions 54. A corresponding upper portion 52 (or lower portion 54) may be coupled to each of the stacked lower portions 54 to clamp or hold the one or more ceramic fibers between the upper and lower portions 52, 54. Two stacked frames 40 each including a planar array 34 of unidirectional fibers 30 may thereby be formed. Once the stacked frames 40 including the ceramic fibers clamped between the upper and lower portions 52, 54 thereof are formed, any portions of the ceramic fibers extending between the frames 40 may be cut or trimmed to separate the frames 40. Such a winding technique may thereby form a pair of frames 40.

As discussed above, the illustrative frame 50 shown in FIGS. 3-5 is only one potential frame configuration. For example, rather than capturing the end portions of the ceramic fibers 30 between an upper portion 52 and a lower portion 54, the frame 40 may include manually engageable clamps or like fastening mechanisms that are configured to selectively couple (and detach) end portions of the ceramic fibers 30 to the frame 40. As another example, end portions of the ceramic fibers 30 may be adhered or glued to the frame 40. In another example, the frame 40 may include one or more hook, pin, channel, aperture or any other like brace structure that is configured to allow one or more of the ceramic fibers to extend thereabout or therethrough to criss-cross or extend in a serpentine fashion across the void 50 and form the planar array 34 of unidirectional ceramic fibers 30. In such an embodiment, a ceramic fiber may extend across the void 50 a first pass along a first direction to a first portion of the frame 40 (to form a first ceramic fiber portion 30), extend about or through a brace mechanism at the first end of the frame 40, and extend back across the void 50 a second pass that is spaced from the first pass along a second direction that is opposite the first direction to a second portion of the frame 40 (to form a second ceramic fiber portion 30). The second portion of the frame 40 may also include a brace mechanism to similarly allow the ceramic fiber 30 to change directions and extend back across the void 50 along the first direction (to form a third ceramic fiber portion 30). The one or more brace mechanism(s) of the frame 40 may be configured to space adjacent passes of the ceramic fiber across the void 50, and arrange the passes of the ceramic fiber across the void 50 into the planar array 34 of unidirectional fibers 30. As noted above however, the frame 40 may be of any configuration or design that forms a void 50 and provides the planar array 34 of unidirectional fibers 30 across the void 50.

Figure 6:
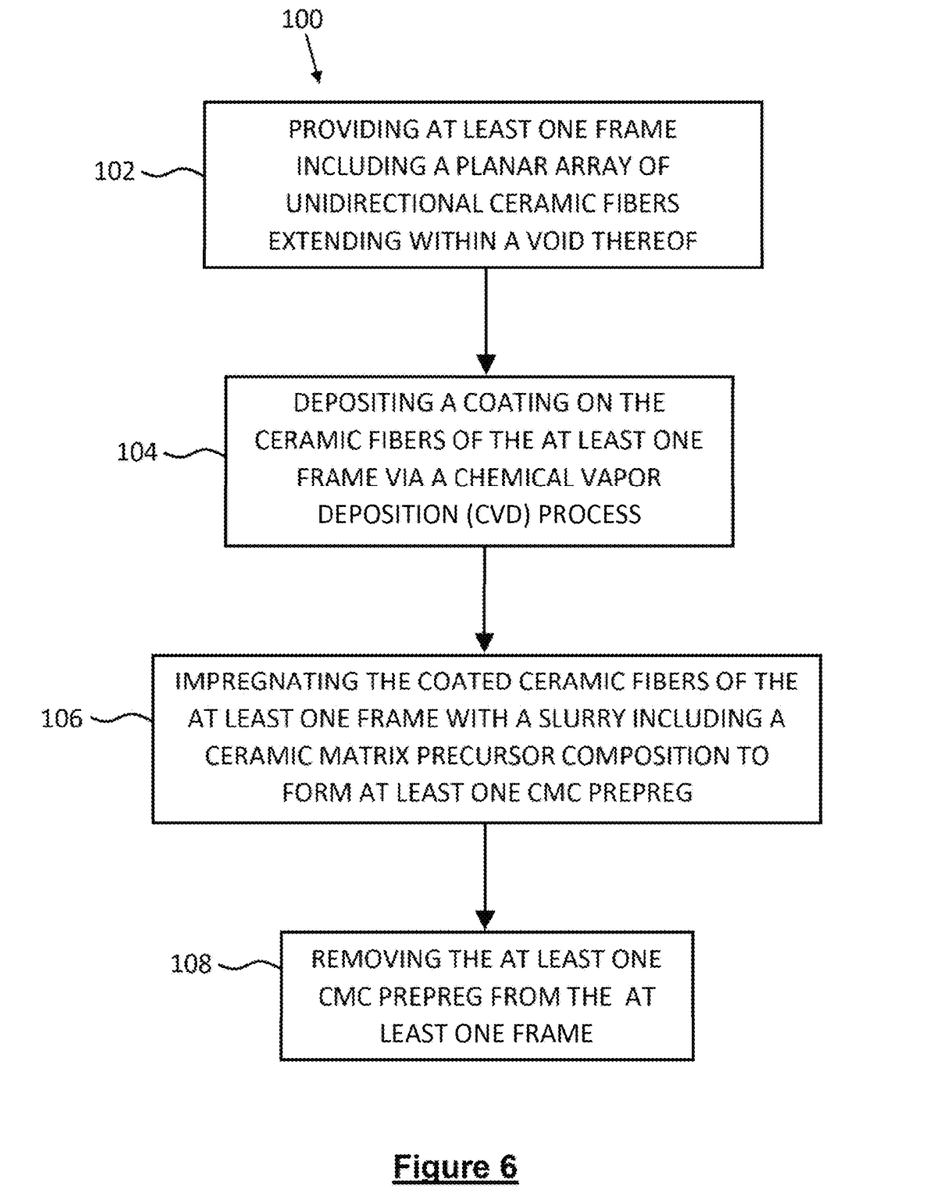
FIG. 6 is a flow chart illustrating a method for processing ceramic fiber for the manufacture of a CMC article according to the present disclosure.

As shown illustrated in the flowchart of FIG. 6, the apparatus 32 of FIGS. 3-5 may facilitate or provide for a method 110 of processing the ceramic fibers 30 coupled to the frame 40 for the manufacture of CMC articles. For example, the apparatus 32 may facilitate coating the ceramic fibers 30 in a process 110. As illustrated in FIG. 6, a ceramic fiber processing method 100 may include providing 102 a plurality of frames 40 each including the planar array 34 of unidirectional ceramic fibers 30 extending across a void 50 thereof. In some embodiments, providing 102 a plurality of frames 40 may include coupling the ceramic fibers 30 to the plurality of frames 40 such that the planar array 34 is formed in the void 50 thereof. In some other embodiments, providing 102 a plurality of frames 40 may include obtaining a plurality of pre-manufactured apparatuses 32 containing the frames 40 with the planar array 34 formed in the voids 50 thereof.

The ceramic fiber processing method 100 may further include depositing 104 at least one coating on the ceramic fibers 30 of the planar array 34 of each of the plurality of frames 40 via a chemical vapor deposition (CVD) process, as illustrated in FIG. 6. For example, one or more frames 40 may be positioned within a CVD reactor and processed therein to deposit a coating on the ceramic fibers 30 of the planar array 34. The CVD reactor may be any CVD reactor effective to deposit the coating on the ceramic fibers 30. In some embodiments, a plurality of frames 40 may be positioned with the CVD reactor and processed to deposit the coating on the ceramic fibers 30. The depositing 104 may be performed as a batch process, such as by positioning at least one frame 40 in the CVD reactor, performing the deposition, and then removing the at least one frame 40 from the CVD reactor. As another example, the depositing 104 may be performed as a continuous process, such as by continuously passing at least one frame 40 through the CVD reactor. In such a continuous process, the multiple frames 40 may be coupled to one another or may be portions of a larger structure, for example, that is continuously passed through the reactor.

Figure 7:
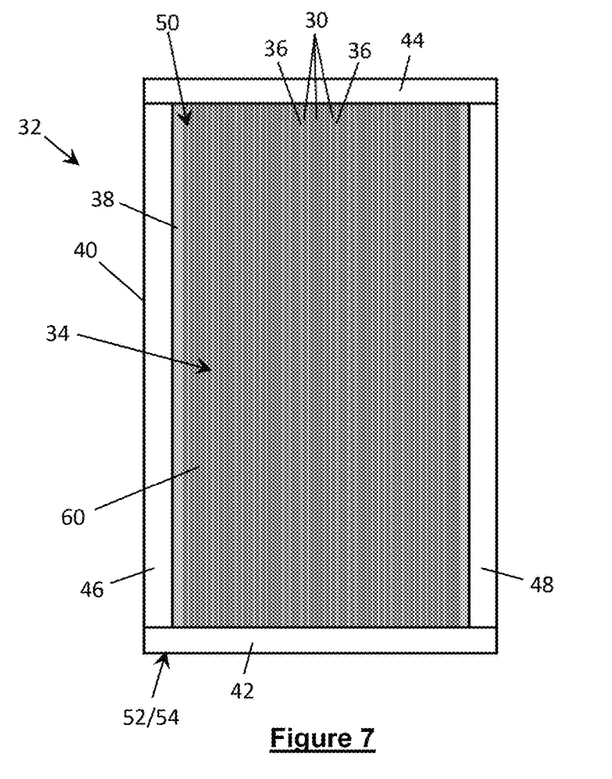
FIG. 7 is a top view of the apparatus of FIG. 3 after coating and impregnating processes.
Figure 8:
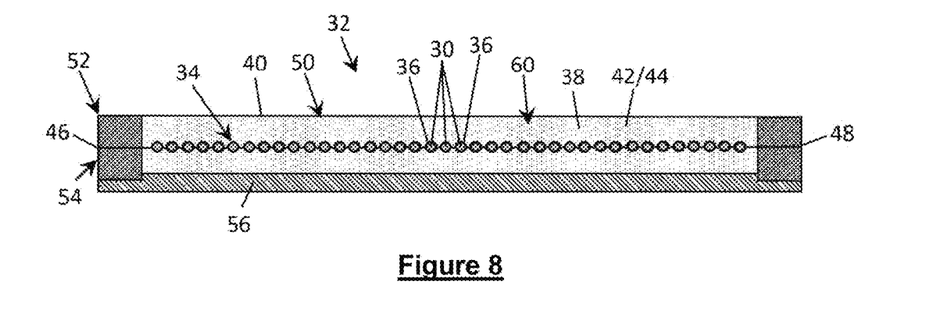
FIG. 8 is a cross-sectional view of the apparatus of FIG. 7.

FIGS. 7 and 8 illustrate the ceramic fibers 30 after a coating 36 has been deposited thereon via the CVD process 104. As shown in FIG. 8, the coating 36 may completely cover or overly the exterior surface of the ceramic fibers 30 of the planar array 34. In some embodiments, the coating 36 may be a single layer of material deposited on the ceramic fibers 30. In other embodiments, the coatings 36 may include multiple layers of the same or differing material deposited on the ceramic fibers 30.

The coating 36 deposited on the ceramic fibers 30 of the planar array 34 positioned across the void 50 via the CVD process 104 may be any coating material utilized to process ceramic fiber for the manufacture of CMC prepregs and/or articles. For example, the coating 36 may be a surface modification to the ceramic fibers 30 that affects the fiber-matrix interface of a resulting CMC article made from the ceramic fibers 30. This can be accomplished by a coating 36 of suitable ceramic material that inhibits the ceramic fibers 30 from reacting or bonding with the matrix of the CMC article. The ceramic coating 36 may allow the ceramic fibers 30 to pull out from the matrix and/or slide along the matrix, thus increasing the fracture toughness of the CMC article. However, a coating 36 that provides an additional and/or differing function(s) and/or other coating types (e.g., non-ceramic) may be utilized. In some embodiments, the CVD coating process 104 may deposit a coating 36 on the ceramic fibers 30 of the planar array 34 positioned across the void 50 including at least one layer including boron nitride, silicon-doped boron nitride, carbon, silicon carbide, silicon nitride or a combination thereof. In some such embodiments, the ceramic fibers 30 may be SiC fibers.

As depicted in FIG. 6, the ceramic fiber processing method 100 may further include impregnating 106 the coated 36 unidirectional ceramic fibers 30 of the planar array 34 of one or more frames 40 with a slurry 38 including a ceramic matrix precursor composition to form one or more CMC prepreg 60. The slurry 38 may be introduced to the frame 40 such that the slurry 38 extends about each of the coated 36 ceramic fibers 30 of the planar array 34. The coated 36 ceramic fibers 30 of the planar array 34 may thereby be encapsulated or fully contained within the slurry 38. In this way, the slurry 38 and the planar array 34 of coated 36 unidirectional ceramic fibers 30 of a frame 40 (i.e., the apparatus 32 subsequent to CVD coating) may form a CMC prepreg tape 60. In an alternative embodiment, the ceramic fiber processing method 100 may include removing the planar array 34 of coated 36 unidirectional ceramic fibers 30 from the void 50 and/or at least a portion of the frame 40 and impregnating 106 the at least partially removed coated 36 ceramic fibers 30 with the slurry 38. In this way the prepregs tape 60 may be formed exterior to the void 50 of the frame 40 and/or after separation thereof from the frame 40.

The apparatus 32 may facilitate forming prepreg tape 60 (with coated ceramic fiber 30) in a batch process, such as by impregnating 106 a plurality of planar arrays 34 of coated 36 unidirectional ceramic fibers 30 with the slurry 38 as a batch, or the planar arrays 34 may be impregnated 106 one at a time. As another example, the impregnating 106 may be performed as a continuous process, such as by continuously passing a plurality of frames 40 through a slurry 38 bath or otherwise continuously impregnating 106 a series or plurality of frames 40. In such a continuous process, the multiple frames 40 may be coupled to one another or may be portions of a larger structure, for example, that is continuously impregnated 106 via a slurry 38 impregnating mechanism or process(es).

Once the planar array 34 of coated 36 unidirectional ceramic fibers 30 is impregnated with the slurry 38, the resulting prepreg 60 may be allowed to dry/set up and/or otherwise processed into a more easily handled form. Thereafter, the prepreg 60 may be removed from the frame 50 (if the prepreg 60 is formed in the frame 50). For example, the prepreg 60 may be decoupled from the frame 50 via the same mechanism previously utilized to couple the pre-coated and/or pre-impregnated ceramic fiber 30 to the frame 50. In some embodiments, the prepreg 60 may include portions of uncoated and/or non-impregnated ceramic fiber 30 extending from portion including coated and impregnated ceramic fiber 30. In such an embodiment, the uncoated and/or non-impregnated ceramic fiber 30 may be trimmed or otherwise removed from the coated and impregnated ceramic fiber 30 portion of the prepreg 60.

The slurry 38 may include any ceramic matrix precursor composition effective to form a CMC prepreg 60 and, ultimately, a CMC article. For example, the CMC prepreg 60 may be utilized to make a CMC article through a melt infiltration (MI) process, a chemical vapor infiltration (CVI) process, or any other process(es). The slurry 38 may be composition particularly suited to SiC ceramic fibers 30. In some embodiments, the slurry 38 may include an oxide-based ceramic matrix precursor composition. In some embodiments, the slurry 38 may include at least one of SiC, TiC, TiB, TiB2, ZrC, HfC, TaC, NbC, ZrSiC, TiSiC, C, Y2O3, ZrO2, Si3N4, Al2O3, ZrO2, SiO2, TiO2 and combinations thereof. For example, the ceramic fibers 30 may be SiC fibers and the slurry may be a SiC ceramic matrix precursor composition to form a SiC—SiC CMC article from the prepreg 60.

FIGS. 7 and 8 also illustrate the coated ceramic fibers 30 after being impregnated 106 with the slurry 38. As shown in the cross-sectional view of FIG. 8, a solid base plate 56 may be coupled to the frame 40 such that a side of the void 50 is substantially sealed. In some embodiments, at least an interior surface of the base plate 56 is adjacent the ceramic fibers 30, and such interior surface may be substantially planar. At least the interior surface of the base plate 56 may thereby extend substantially parallel to the planar array 34 of the ceramic fibers 30. The frame 40 may be configured such that an area of the void 50 above the base plate 56 in a thickness direction is also substantially sealed. The thickness direction may extend substantially normal to the planar array 34. The frame 40 and the base plate 56 may thereby enclose a portion of the void 50 to form a well or receptacle capable of holding the slurry 38 therein. Slurry 38 can thereby be introduced into the void 50 and contained therein by the frame 40 and the base plate 56. As another example, the base plate 56 may be aligned with or positioned above the frame 40 and adjacent to the planar array 34 such that the base plate provides for tape casting of the planar array 34 with slurry 38 to form prepreg tape. The base plate 56 a may be otherwise configured to provide for tape casting of the planar array 34 with the slurry 38 to form to form prepreg tape.

In one example, the planar array 34 may be spaced above the base plate 56 but below a top surface of the frame 40 in the thickness direction, as shown in FIG. 8. The well formed by the frame 40 and the base plate 56 may thereby contain the planar array 34. Enough slurry 38 may be introduced into the void 50 such that the slurry 38 extends below the ceramic fibers 30, between the ceramic fibers 30, and above the ceramic fibers 30. However, as explained above, a well may or may not be formed by the base plate 56. The thickness of the prepreg tape 60 formed by the apparatus 30 may be controlled, in part, by the space between the base plate 56 and the ceramic fibers 30 and the amount of slurry 38 extending over the top of the ceramic fibers 30. In some embodiments, the apparatus 30 may be configured such that the planar array 34 of ceramic fibers 30 is evenly spaced above the base plate 56 and below the top surface of the frame 40 in the thickness direction, for example, as shown in FIG. 8. In such an embodiment, the slurry 38 may be introduced into and substantially fill the void 50. The top surface of the frame 40 may be used as a knifing or screening reference to form a prepreg 60 with an equal amount of matrix precursor above and below the planar array 34 of ceramic fibers 30. In other embodiments, the planar array 34 of ceramic fibers 30 may not be spaced below the top surface of the frame 40 and/or the top surface of the frame 40 may not be used a knifing or screening reference.

While one illustrative frame 30 embodiment is shown in FIGS. 7 and 8 for impregnating 106 the planar array 34 of coated 36 unidirectional ceramic fibers 30 of the frame 40 with a ceramic matrix precursor slurry 38 to form a CMC prepreg 60, any arrangement or configuration may be utilized that is effective in impregnating 106 the planar array 34 with the slurry 38. For example, as discussed above at least a portion of the frame 40 may be removed from the planar array 34 of coated 36 unidirectional ceramic fibers 30 prior to the impregnating 106. As another example, a second backing plate may be utilized to seal the open side of the void 50, and at least one of the backing plates may include a port for introducing the slurry 38 into the sealed void 50.

EXAMPLE

An example of the apparatuses and methods of processing ceramic fiber disclosed herein was carried out. A pair of graphite frame portions, as discussed below, were configured with substantially planar arrays of unidirectional SiC fibers. The planar arrays of substantially unidirectional SiC fibers were coated with a CVD process, and the coated SiC fibers were impregnated with a SiC-containing slurry to produce a prepreg tape.

The frame portions were about 10 inches in length, about 1.25 inches in width, and about 0.0625 inches in thickness in outer dimensions. The frame portions formed a void of about 8 inches in length, 1 inch in width and 0.0625 inches in thickness. The two frames were fastened together with pins in a stacked relationship, i.e., an upper frame portion and a lower frame portion were stacked to form a single frame construct. A single length, of approximately 15 m, of SiC fiber tow was wound around the frame construct such that the tow formed two substantially unidirectional planar arrays oriented lengthwise along the voids. The SiC tows were bundles of approximately 500 filaments of approximately 13 microns in diameter. The two free ends of the tow were fastened to the frame construct on the spacing members of the frame portions using a carbon glue.

The frame construct with the two substantially unidirectional planar arrays was disposed in a high-temperature, low-pressure CVD reactor as a batch process, and three coatings were deposited sequentially on the fibers of the tow adjacent and across the voids: boron nitride, silicon-doped boron nitride and silicon nitride. The frame construct was subsequently disposed in a high-temperature, atmospheric CVD reactor, and a pyrolytic carbon coating was deposited on the fibers.

The two frame portions of the frame construct were separated after coating of the fibers. The regions of the two fiber arrays that passed over the support members of the frame portions were fastened to the support members, and the fibers were cut at the upper and lower sides of the frame portions at the point where the fibers wound around the length-ends of the frame portions. Each separated individual frame portion was disposed on a metal block that acted as the base plate and defined the space about the coated fiber arrays for infiltration. A sheet of Mylar was disposed between the metal block and the coated fiber arrays. A slurry containing SiC was disposed into the frame portions using a reservoir with an opening to dispense the slurry. The slurry was introduced from one length end of the frame portions to the other length end. The slurry impregnated the coated fiber arrays coupled to the frame portions. The slurry was allowed to dry and thereby form prepreg tapes. The tapes were finally removed from the frame portions.

It is to be understood that the above description is intended to be illustrative, and not restrictive. Numerous changes and modifications may be made herein by one of ordinary skill in the art without departing from the general spirit and scope of the invention as defined by the following claims and the equivalents thereof. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Also, the term "operably connected" is used herein to refer to both connections resulting from separate, distinct components being directly or indirectly coupled and components being integrally formed (i.e., monolithic). Further, the limitations of the following claims are not written in means-plus-function format and are not intended to be interpreted based on 35 U.S.C. § 112, sixth paragraph, unless and until such claim limitations expressly use the phrase "means for" followed by a statement of function void of further structure. It is to be understood that not necessarily all such objects or advantages described above may be achieved in accordance with any particular embodiment. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the disclosure may include only some of the described embodiments. Accordingly, the invention is not to be seen as limited by the foregoing description, but is only limited by the scope of the appended claims.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

We claim:

1. A method of processing ceramic fiber for the manufacture of a ceramic matrix composite (CMC) article, comprising:
providing at least one frame including a planar array of unidirectional ceramic fibers extending across a void thereof; and
impregnating the ceramic fibers of the at least one frame with a slurry including a ceramic matrix precursor composition to form at least one CMC prepreg, wherein impregnating the ceramic fibers of the at least one frame includes coupling a base plate to the at least one frame extending at least partially within the void thereof such that the ceramic fibers and the ceramic matrix precursor composition form at least one CMC prepreg tape.

2. The method of claim 1, wherein the ceramic fibers include a coating comprising at least one layer including boron nitride, silicon-doped boron nitride, carbon, silicon carbide or silicon nitride.

3. The method of claim 2, wherein the method further includes depositing the coating on the ceramic fibers of the least one frame via a chemical vapor deposition (CVD) process.

4. A method of processing ceramic fiber for the manufacture of a ceramic matrix composite (CMC) article, comprising:
providing at least one frame including a planar array of unidirectional ceramic fibers extending across a void thereof;

depositing a coating on the ceramic fibers of the least one frame via a chemical vapor deposition (CVD) process; and impregnating the ceramic fibers of the at least one frame with a slurry including a ceramic matrix precursor composition to form at least one CMC prepreg, wherein impregnating the ceramic fibers of the at least one frame includes coupling a base plate to the at least one frame extending at least partially within the void thereof such that the ceramic fibers and the ceramic matrix precursor composition form at least one CMC prepreg tape.

5. The method of claim 4, wherein the CVD process includes positioning the at least one frame within a CVD reactor, and wherein the CVD process is a batch CVD process.

6. The method of claim 4, wherein the coating comprises at least one layer including boron nitride, silicon-doped boron nitride, carbon, silicon carbide or silicon nitride.

7. The method of claim 4, wherein the ceramic fibers include a coating comprising at least one layer including boron nitride, silicon-doped boron nitride, carbon, silicon carbide or silicon nitride.

8. The method of claim 4, wherein at least one of the ceramic fibers comprises a ceramic fiber tow.

9. The method of claim 4, wherein at least one of the ceramic fibers comprises a non-bundled ceramic filament.

10. The method of claim 4, wherein a plurality of the ceramic fibers comprise portions of at least one continuous ceramic fiber that extends through the void a plurality of times.

11. The method of claim 4, wherein at least one of the ceramic fibers comprises a portion of at least one discrete ceramic fiber that extends once through the void.

12. The method of claim 4, wherein the ceramic fibers are substantially SiC.

\* \* \* \* \*